United States Patent
Matsumoto et al.

(10) Patent No.: US 8,203,169 B2
(45) Date of Patent: Jun. 19, 2012

(54) GLASS, COATING MATERIAL FOR LIGHT-EMITTING DEVICES AND LIGHT-EMITTING DEVICE

(75) Inventors: Syuji Matsumoto, Tokyo (JP); Nobuhiro Nakamura, Tokyo (JP); Naoya Wada, Tokyo (JP); Yasuko Osaki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 128 days.

(21) Appl. No.: 12/817,323

(22) Filed: Jun. 17, 2010

(65) Prior Publication Data

US 2010/0252858 A1    Oct. 7, 2010

Related U.S. Application Data

(63) Continuation of application No. PCT/JP2009/050252, filed on Jan. 9, 2009.

(30) Foreign Application Priority Data

Jan. 10, 2008    (JP) .................................. 2008-003553

(51) Int. Cl.
*H01L 33/00* (2010.01)
*C03C 3/19* (2006.01)

(52) U.S. Cl. .................... 257/100; 257/E33.059; 501/47

(58) Field of Classification Search .................. 257/100, 257/E33.059; 501/47
See application file for complete search history.

(56) References Cited

U.S. PATENT DOCUMENTS

| | | | |
|---|---|---|---|
| 5,281,560 A | 1/1994 | Francis et al. | |
| 5,714,840 A * | 2/1998 | Tanabe et al. | 313/581 |
| 2008/0136326 A1 | 6/2008 | Nakamura et al. | |
| 2009/0059591 A1 | 3/2009 | Nakamura et al. | |
| 2009/0072265 A1 | 3/2009 | Nakamura et al. | |
| 2009/0239318 A1 | 9/2009 | Nakamura et al. | |
| 2010/0065882 A1 | 3/2010 | Matsumoto et al. | |
| 2010/0155764 A1 | 6/2010 | Serita et al. | |

FOREIGN PATENT DOCUMENTS

| | | |
|---|---|---|
| JP | 07-069672 | 3/1995 |
| JP | 08-301631 | 11/1996 |
| JP | 9-175833 | 7/1997 |
| JP | 09-235136 | 9/1997 |
| JP | 10-316451 | 12/1998 |
| JP | 2001-139344 | 5/2001 |
| JP | 2001-302279 | 10/2001 |
| JP | 2005-015280 | 1/2005 |
| JP | 2005-319150 | 11/2005 |
| JP | 2005-350314 | 12/2005 |
| JP | 2008-019421 | 1/2008 |

OTHER PUBLICATIONS

European Exteded Search Report issued Nov. 29, 2010, in Application No. / Patent No. 09701328.8-1218 /2228350 PCT/JP2009050252.

* cited by examiner

*Primary Examiner* — Victor A Mandala

(74) *Attorney, Agent, or Firm* — Oblon, Spivak, McClelland, Maier & Neustadt, L.L.P.

(57) ABSTRACT

To provide glass with which a sealing treatment can be carried out at a temperature of at most 400° C. and which does not deteriorate or change in quality for a long time.
Glass comprising, as represented by mol % based on oxides, from 27 to 33% of $P_2O_5$, from 50 to 70% of SnO, from 0 to 10% of ZnO, from 0.5 to 5% of CaO and from 0 to 5% of $B_2O_3$.

14 Claims, 2 Drawing Sheets

GLASS, COATING MATERIAL FOR LIGHT-EMITTING DEVICES AND LIGHT-EMITTING DEVICE

TECHNICAL FIELD

The present invention relates to glass, particularly glass used for a sealing material for light-emitting devices such as light-emitting diode (LED) devices.

BACKGROUND ART

In light-emitting diode (LED) devices, an organic material such as a resin has been conventionally used as a sealing material for sealing and coating an LED element and a substrate which supports the LED element. However, the sealing material made of a resin tends to deteriorate due to heat generated by driving devices, light and/or moisture in the environment, and the life span of such a sealing material is short. Thus, a stable substitute material for the sealing material made of a resin has been desired.

As such a substitute material which can solve the above problem and is stable against heat, light and/or moisture in the environment, a sealing material made of glass is conceivable. However, in a case of conventional sealing materials made of glass, the temperature for sealing treatment at a level of 500° C. or higher is required due to the restriction of the glass softening points. The sealing treatment at such a high temperature is not preferred to members constituting LED devices from the viewpoint of reliability. Therefore, in order to use glass as a sealing material, glass which can be seal-treated at a sealing treatment temperature of lower than 500° C. is required.

Further, Patent Document 1 discloses $P_2O_5$—SnO glass for sealing a cathode-ray tube (CRT) wherein the sealing treatment temperature is from 400° C. to 430° C.
Patent Document 1: JP-A-7-69672

DISCLOSURE OF THE INVENTION

Problems to be Solved by the Invention

As mentioned above, it is an object of Patent Document 1 to seal CRT (to seal a glass panel and a glass funnel). Therefore, in the glass of Patent Document 1, the most important factor for the determination of its composition is glass strength. That is, in the glass of Patent Document 1, the glass transition temperature (Tg) is lowered to a level of from 250° C. to 275° C. so that the glass is intentionally crystallized to obtain the strength. That is, in Patent Document 1, the strength is improved by sacrificing crystallization.

Further, in the glass of Patent Document 1, the composition is determined by assuming CRT having a large area as an object to be sealed. Therefore, it is necessary to lower the viscosity at the sealing temperature, and the glass transition temperature (Tg) is intentionally lowered.

However, the glass of Patent Document 1 is not suitable as a sealing material for a small light-emitting device such as LED device. As one reason, although crystal is not problematic for glass as a sealing material for a large device, crystal becomes critically problematic for glass as a sealing material for a small device (particularly glass as a sealing material for a light-emitting device) such that efficiency to correct light is lowered. That is, in the case of the glass of Patent Document 1, even though crystal formed in glass is tiny, since glass as a sealing material is small, the crystal interferes with the travel of light emitted from a light-emitting device, and the optical amount of the light-emitting device is lowered. Further, as another reason, although the viscosity is not problematic for glass as a sealing material for a large device, the working efficiency in the production is lowered due to the viscosity in the case of glass as a sealing material for a small device. That is, in the case of the glass of Patent Document 1, the viscosity of the glass is low, it is difficult for fluidized glass to stay on a small device, and sealing with the desired thickness is difficult.

The present invention has been accomplished to solve such a problem, and it is an object of the present invention to provide glass which can be sealed at a sealing treatment temperature of less than 400° C., and which is free from deterioration or change in quality for a long period of time.

Further, it is an object of the present invention to provide a sealing material made of such glass for light-emitting devices, and a light-emitting device having such a sealing material.

Means to Solve the Problems

The present invention provides glass comprising, as represented by mol % based on oxides,
from 27 to 33% of $P_2O_5$,
from 50 to 70% of SnO,
from 0 to 10% of ZnO,
from 0.5 to 5% of CaO,
from 0 to 5% of $B_2O_3$,
from 0 to 3% of $Ga_2O_3$,
from 0 to 3% of $In_2O_3$ and
from 0 to 3% of $La_2O_3$.

Here, the glass preferably contains, as represented by mol % based on oxides, from 52 to 63% of SnO and from 85 to 92% of the total of $P_2O_5$+SnO.

Further, the content of $P_2O_5$ is preferably from 27% to 30% as represented by mol % based on oxides.

Further, the content of CaO is preferably from 3% to 5% as represented by mol % based on oxides.

Further, the present invention relates to a light-emitting device comprising a base substrate; a light-emitting element formed on the base substrate; and a sealing material for the light-emitting element, characterized in that the sealing material is made of the above glass.

Effects of the Invention

According to the present invention, sealing with transparent glass can be carried out at a sealing treatment temperature of at most 400° C., and glass which is free from deterioration or change in quality for a long period of time can be provided. Further, a sealing material made of such glass for a light-emitting device, and a light-emitting device comprising such a sealing material can be provided.

Figure 1:
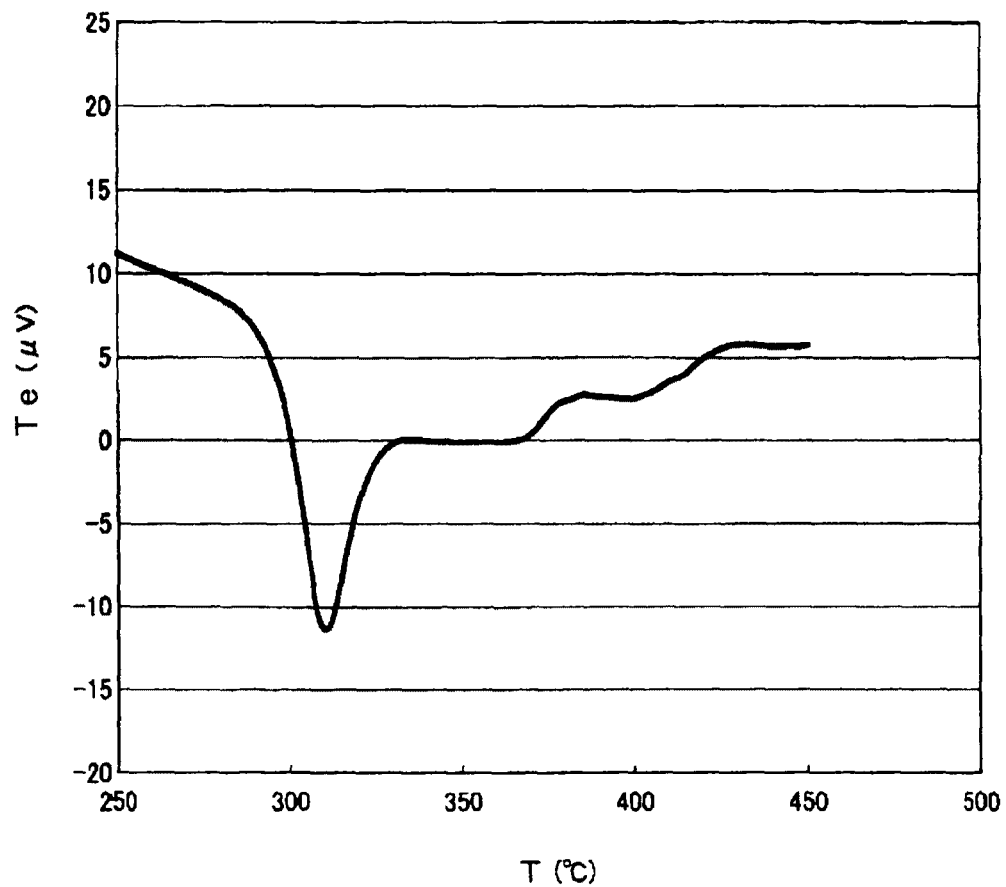
FIG. 1 is a graph showing one example of the result of DTA measurement of the glass of the present invention. The abscissa represents T (temperature, ° C.) and the ordinate represents Te (thermal electromotive force, μV).

| EXPLANATION OF SYMBOLS | |
|---|---|
| 1: | LED |
| 100: | Light-emitting part |
| 101: | Substrate for elements |
| 102: | LED element |
| 103: | Positive electrode |
| 104: | Negative electrode |
| 110: | Covering part |
| 115: | Coating material |
| 120: | Base substrate |
| 130a and 130b: | Wiring |

BEST MODE FOR CARRYING OUT THE INVENTION

The mode for carrying out the present invention will be described in detail with reference to the attached drawings. The following mode for carrying out the invention is one example, and various modifications may be made without departing from the technical concept of the present invention.

First, the glass of the present invention will be described.

The glass of the present invention comprises, as represented by mol % based on oxides, from 27 to 33% of $P_2O_5$, from 50 to 70% of SnO, from 0 to 10% of ZnO, from 0.5 to 5% of CaO, from 0 to 5% of $B_2O_3$, from 0 to 3% of $Ga_2O_3$, from 0 to 3% of $In_2O_3$ and from 0 to 3% of $La_2O_3$.

With such glass of the present invention, sealing treatment at a temperature of at most 400° C. can be made possible. Further, the glass of the present invention has a feature that it has a relatively high glass transition temperature (Tg) at a level of from about 285 to 300° C.

In general, in a case where glass is used as a sealing material for a light-emitting device such as LED device, a sealing treatment temperature at a level of about 500° C. or higher is required due to the restriction of the softening point of glass. However, if the sealing treatment is carried out at such a high temperature, members constituting the light-emitting device are likely to be impaired due to heat, and the reliability of the device may be impaired.

In order to solve such a problem, $P_2O_5$—SnO glass with which the sealing treatment can be carried out at about 400° C. (hereinafter referred to as "conventional glass") has been proposed. However, such conventional glass has a glass transition temperature (Tg) of from 250° C. to 275° C.

Indeed, it is effective to lower the glass transition temperature (Tg) in order to lower the temperature for the sealing treatment for sealing materials made of glass. However, if the glass transition temperature (Tg) of $P_2O_5$—SnO glass is significantly lowered, the following problems result.

That is, in order to lower the glass transition temperature (Tg) of the $P_2O_5$—SnO glass, it is necessary to relatively increase the content of $P_2O_5$. However, if the content of $P_2O_5$ is increased, the chemical stability of such glass deteriorates. Because at the vicinity of this composition range, $P_2O_5$ tends to react with moisture in the environment. Particularly, if the content of $P_2O_5$ exceeds 33 mol %, this influence is remarkable. As a result of the deterioration of the chemical stability of such a sealing material, the sealing material undergoes deterioration and change in quality as time passes. Particularly, if the sealing material is stained due to the change in quality (for example, white staining or black staining), the transparency of the sealing material is impaired, and the sealing material is devitrified.

Here, in the case of a small light-emitting device such as LED device, a sealing material used in such a device is required to be sufficiently transparent for not impairing emission of light from LED elements. Therefore, if the above mentioned devitification of the sealing material results, even though such a region is very small, light output from the LED device is significantly lowered.

Whereas, the glass of the present invention has a feature that the sealing treatment at a temperature of at most 400° C. can be carried out, and the glass transition temperature (Tg) is relatively high at a level of from 285 to 300° C. In such glass, the content of $P_2O_5$ in the composition is significantly lowered (at most 33 mol %), whereby the deterioration of the chemical stability is significantly suppressed. Accordingly, the progress of deterioration and change in quality of glass due to environmental factors (for example moisture) as well as the devitrification can be significantly suppressed. Therefore, the glass of the present invention has an effect such that the proper transparency can be maintained for a long period of time.

Further, the glass of the present invention can be used as a sealing material for a light-emitting device stably for a long period of time. Further, since Tg is almost within a range of from 185° C. to 300° C., the viscosity is also high, and the glass of the present invention can be suitably used as a sealing material for small devices.

FIG. 1 shows the results of DTA (differential thermal analysis) of the glass of the present invention. The measurement was carried out by using 110 mg of a glass sample and heating the sample from room temperature to 450° C. at a rate of temperature rise of 10° C./min. Differential thermal analysis apparatus EXSTAR6000TG/DTA, manufactured by Seiko Instruments Inc., was used for the measurement. Further, in FIG. 1, the abscissa shows the thermal electromotive force Te (μV), and the ordinate shows the temperature T (° C.). Further, the glass contains, as calculated by mol % based on oxides, 30% of $P_2O_5$, 60% of SnO, 7% of ZnO and 3% of CaO.

Now, characteristics and appropriate contents of the respective components contained in the glass of the present invention will be described. Further, the characteristics of the respective components shown below are merely exemplary, and other characteristics and effects of the components are not denied.

$P_2O_5$ is a component for stabilizing glass and essential. If the content of $P_2O_5$ is less than 27 mol %, the glass transition temperature (Tg) may be high. Further, as mentioned above, if the content of $P_2O_5$ exceeds 33 mol %, the resistance to the environment (particularly moisture) may be impaired. The content of $P_2O_5$ is particularly preferably from 27 mol % to 30 mol %.

SnO is a component for improving the fluidity of glass and essential. If the content of SnO is less than 50 mol %, the softening point becomes too high, and the fluidity deteriorates. Further, if the content of SnO exceeds 70 mol %, the vitrification becomes difficult. Particularly, when the content of SnO is from 52 mol % to 63 mol %, and the total content of $P_2O_5$+SnO is from 85 mol % to 92 mol %, Tg is within a more preferred range.

ZnO is not essential, however, ZnO has effects to improve the water resistance of glass, lower the thermal expansion coefficient, etc. ZnO is preferably contained within a range of from 0 to 10 mol %. If the content of ZnO exceeds 10 mol %, devitrification tends to result. Further, the content of ZnO is preferably at most ⅓ of the content of SnO. If the content of ZnO exceeds ⅓ of the content of SnO, the softening point becomes too high, and/or crystallization may be accelerated.

CaO is a component for suppressing crystallization of glass and lowering the thermal expansion coefficient, and CaO is essential. If the content of CaO is less than 0.5 mol %, the crystallization may not be suppressed. The content of CaO is preferably at least 1 mol %. Further, if the content of CaO exceeds 5 mol %, glass becomes unstable. The content of CaO is particularly preferably from 3 mol % to 5 mol %, since glass is transparent in a broad temperature range, and softening sealing can be carried out.

Although $B_2O_3$ is not essential, $B_2O_3$ may be contained up to 5 mol % as a compound for supporting CaO for the suppression of crystallization. If the content of $B_2O_3$ exceeds 5 mol %, the refractive index becomes small, and the chemical resistance such as moisture resistance may be impaired. The total content of CaO and $B_2O_3$, namely A (A=the total content by mol % of CaO+$B_2O_3$) is preferably from 0.5 mol % to 5 mol %. If A is less than 0.5 mol %, the effect to suppress crystallization cannot be obtained. Further, if A exceeds 5 mol %, the softening point becomes too high.

$Ga_2O_3$ is a component for improving moisture resistance and stabilizing glass, and $Ga_2O_3$ may be contained up to 3 mol %. If the content of $Ga_2O_3$ exceeds 3 mol %, the softening point becomes too high, and it is difficult to use such a sealing material in a sealing treatment at a sealing temperature of at most 400° C. The content of $Ga_2O_3$ is preferably at most 2 mol %, more preferably at most 1 mol %.

$In_2O_3$ is a component for improving moisture resistance and stabilizing glass, and $In_2O_3$ may be contained up to 3 mol %. If the content of $In_2O_3$ exceeds 3 mol %, the softening point becomes too high, and it is difficult to use such a sealing material in a sealing treatment at a sealing temperature of at most 400° C. The upper limit of the content of $In_2O_3$ is preferably 2 mol %, more preferably 1 mol %.

$La_2O_3$ is a component for improving moisture resistance and stabilizing glass, and $La_2O_3$ may be contained up to 3 mol %. If the content of $La_2O_3$ exceeds 3 mol %, the softening point becomes too high, and it is difficult to use such a sealing material in a sealing treatment at a sealing temperature of at most 400° C. The upper limit of the content of $La_2O_3$ is preferably 2 mol %, more preferably 1 mol %.

The glass of the present invention is composed substantially of the above components. However, so long as the object of the present invention is not impaired, another component such as MgO, SrO, $Bi_2O_3$, $Y_2O_3$, $Gd_2O_3$, $Ce_2O_3$, $CeO_2$, $TiO_2$, $TeO_2$, or $Ta_2O_5$ may be added.

Further, the glass of the present invention preferably contains substantially no PbO. Further, the glass of the present invention preferably contains substantially no $Li_2O$, $Na_2O$ or $K_2O$. If such a component is present in glass in a substantial amount, semiconductor elements may deteriorate due to ion diffusion. Further, the glass of the present invention preferably contains substantially no MnO, $Fe_2O_3$, $Co_2O_3$ or $WO_3$. If such a component is present in glass in a substantial amount, the transparency of glass may be impaired due to coloration.

The upper limit of the thermal expansion coefficient (a) of the glass of the present invention is preferably $130 \times 10^{-7}$/° C., more preferably $128 \times 10^{-7}$/° C. The lower limit of the thermal expansion coefficient (a) is preferably $110 \times 10^{-7}$/° C., more preferably $115 \times 10^{-7}$/° C. If the thermal expansion coefficient (a) is less than $110 \times 10^{-7}$/° C., the glass transition temperature (Tg) raises. Further, if the thermal expansion coefficient (a) exceeds $130 \times 10^{-7}$/° C., breakage of glass may start from a part which is in contact with a light-emitting device in a step of cooling the light-emitting device to room temperature after sealing it with the glass, or in the subsequent step.

The glass of the present invention having the above composition can be used as a sealing material for a light-emitting device having a glass sealed part. Now, the construction of a light-emitting device provided with the glass of the present invention as a sealing material will be described with reference to LED device as an example. Further, the glass of the present invention can be used as a sealing material for other light-emitting devices.

Figure 2:
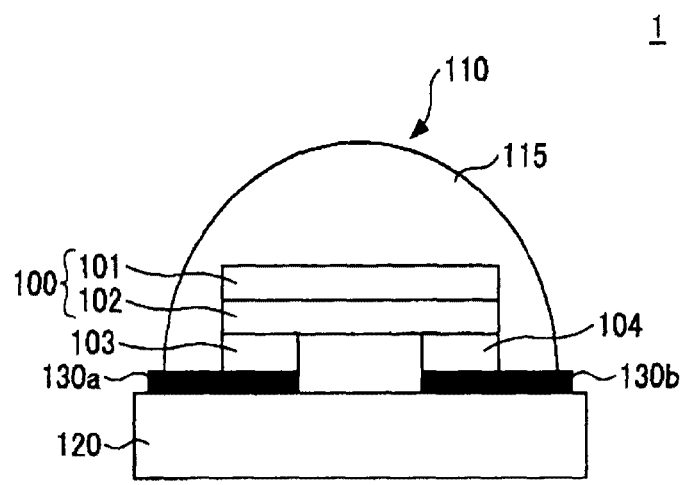
FIG. 2 is a figure showing one example of a cross-sectional view of the light-emitting device of the present invention.

FIG. 2 shows a schematic cross-section of the LED device 1 of the present invention as one example. The LED device 1 has a base substrate 120, a light-emitting part 100 provided on the base substrate 120 and a covering 110 for covering the light-emitting part 100.

Plural wirings 130 (130a and 130b) are formed on the surface of the base substrate 120 on which the light-emitting part 100 is provided.

The base substrate 120 may, for example, be constructed by a substrate of a rectangular shape having a thickness of from 0.2 to 1.2 mm and made of an inorganic material such as alumina having a purity of 98.0 to 99.5%. The wirings 130a and 130b formed on the base substrate 120 may, for example, be gold wirings formed by a gold paste.

The light-emitting part 100 is constructed by providing an LED element 102 on the substrate 101 for the element. The LED element 102 has a positive electrode 103 and a negative electrode 104 on the side opposite to the substrate 101 for the element. The light-emitting part 100 is provided on the base substrate 120 so that these electrodes 103 and 104 contact the wirings 130a and 130b on the base substrate 120, respectively.

The LED element 102 is constructed by, for example, LED which emits ultraviolet ray or blue ray having a wavelength of from 360 to 480 nm and may be LED (InGaN type LED) having a quantum well structure of which a light-emitting layer is InGaN wherein In is added in GaN. Here, other types of LED may be used. The substrate 101 for the element has a thermal expansion coefficient of, for example, from $70 \times 10^{-7}$ to $90 \times 10^{-7}$/° C. As a material for the substrate 101 for the element, sapphire having a thermal expansion coefficient of about $80 \times 10^{-7}$/° C. is usually used.

The covering part 110 is constructed by the sealing material 115, and the sealing material 115 is constructed by the glass having the above-mentioned composition.

In the case of such a light-emitting device 1, the sealing material 115 for covering the light-emitting part 100 can be provided at a sealing treatment temperature of at most 400° C. Accordingly, heat damage to the respective members constituting the light-emitting device 1 can be significantly suppressed. Further, the glass transition temperature (Tg) of the sealing material is within a range of from 285 to 300° C. Accordingly, the change in quality, deterioration and the progress of devitrification due to moisture in the environment which are problematic in the conventional glass can be significantly suppressed. Therefore, the light-emitting device which can stably output light for a long period of time can be provided.

EXAMPLES

Now, the present invention will be described in further detail with reference to Examples. However, the present invention is by no means restricted thereto.

Examples and Comparative Examples are explained with reference to Table 1. Examples 1 to 8 in the Table are Working Examples, and Example 9 is Comparative Example.

TABLE 1

| Composition (mol %) | Example 1 | 2 | 3 | 4 | 5 | 6 | 7 | 8 | 9 |
|---|---|---|---|---|---|---|---|---|---|
| $P_2O_5$ | 30 | 30 | 30 | 30 | 30 | 30 | 30 | 32 | 30 |
| SnO | 60 | 60 | 60 | 60 | 62 | 60 | 60 | 58 | 60 |
| ZnO | 7 | 5 | 9 | 6 | 4 | 8.5 | 9.5 | 8 | 9.5 |
| CaO | 3 | 5 | 1 | 3 | 3 | 0.5 | 0.5 | 2 | 0 |
| $B_2O_3$ | 0 | 0 | 0 | 1 | 1 | 1 | 0 | 0 | 0.5 |
| Glass transition temperature Tg (° C.) | 295.4 | 299.9 | 288.9 | 298.5 | 297.1 | 291.2 | 289.5 | 285 | 287.6 |
| Thermal expansion coefficient α (×10$^{-7}$/° C.) | 126.2 | 127.2 | 124.5 | 121.1 | — | 121.6 | 122.8 | — | 121.7 |
| Sealing at 360° C. | *1 | *1 | *1 | *1 | *1 | *2 | *2 | — | *2 |
| Sealing at 370° C. | *1 | *1 | ◯ | ◯ | ◯ | ◯ | ◯ | — | *2 |
| Sealing at 380° C. | ◯ | ◯ | ◯ | ◯ | ◯ | ◯ | ◯ | — | *3 |
| Sealing at 390° C. | ◯ | ◯ | ◯ | ◯ | ◯ | *3 | *3 | — | *3 |
| Sealing at 400° C. | ◯ | ◯ | *3 | ◯ | ◯ | *3 | *3 | — | *3 |
| Weather resistance test 80° C. 80% RH | — | — | — | — | ◯ | — | — | Δ | — |

Example 1

Glass (glass of Example 1) comprising, as calculated by mol % based on oxides, 30% of $P_2O_5$, 60% of SnO, 7% of ZnO and 3% of CaO was prepared by the following method.

First, predetermined amounts of respective powders of SnO, ZnO and CaO were weighed, and 2 g of saccharose was added thereto and mixed sufficiently. This mixed powder was put in a container made of "Teflon" (tradename), and 200 mL of deionized water was added thereto and stirred to obtain a slurry of the mixed powder.

Next, an orthophosphoric acid aqueous solution (containing 85 mass % of $H_3PO_4$) was added to the slurry to prepare a mixed solution. Here, at the time of pouring the orthophosphoric acid aqueous solution, the orthophosphoric acid aqueous solution was poured gradually while stirring the slurry in order to prevent bumping of water. Then, the obtained mixed solution was poured in a vat made of stainless steel and sealed with a sheet of "Teflon" (tradename). This vat was left at 200° C. for 3 hours while sufficiently ventilating and then dried to obtain 200 g of a cookie state solid.

Further, the respective powders and the orthophosphoric acid aqueous solution were weighed so that the respective components contained in the finally obtained solid (200 g) would be in the above-mentioned molar concentrations.

Then, the obtained solid was put in a crucible made of quartz, a lid made of quartz was placed on the top of the crucible, and the crucible was left at 1,100° C. for 40 minutes to melt the solid. Further, in order to homogenize the melted glass, during the melting treatment, the crucible was taken out from the furnace only one time, the lid was removed, and the melted glass was stirred by using a quartz stick. Then, the lid was placed on the crucible again, and the crucible was returned in the furnace. After the termination of the melting treatment at 1,100° C. for 40 minutes, the crucible was taken out from the furnace. Further, the melted glass in the crucible was poured in a carbon mold in order to form the melted glass into a plate shape. Then, the glass removed from this carbon mold was put in an electronic furnace maintained at 315° C. and left for 1 hour in the electronic furnace, followed by cooling to room temperature over a period of 12 hours.

The glass of Example 1 was obtained by the above process.

Further, in the above process, the orthophosphoric acid aqueous solution was used as a material of $P_2O_5$ contained in the glass. However, instead of the orthophosphoric acid aqueous solution, a powder material such as zinc phosphate, tin phosphate, calcium phosphate or aluminum phosphate may be used. In such a case, all components contained in the glass can be prepared as solid powders, and the step of mixing the slurry and the powders can be omitted.

Example 2

Glass (glass of Example 2) comprising, as calculated by mol % based on oxides, 30% of $P_2O_5$, 60% of SnO, 5% of ZnO and 5% of CaO was prepared in the same manner as in Example 1.

Example 3

Glass (glass of Example 3) comprising, as calculated by mol % based on oxides, 30% of $P_2O_5$, 60% of SnO, 9% of ZnO and 1% of CaO was prepared in the same manner as in Example 1.

Example 4

Glass (glass of Example 4) comprising, as calculated by mol % based on oxides, 30% of $P_2O_5$, 60% of SnO, 6% of ZnO, 3% of CaO and 1% of $B_2O_3$ was prepared in the same manner as in Example 1.

Example 5

Glass (glass of Example 5) comprising, as calculated by mol % based on oxides, 30% of $P_2O_5$, 62% of SnO, 4% of ZnO, 3% of CaO and 1% of $B_2O_3$ was prepared in the same manner as in Example 1.

Example 6

Glass (glass of Example 6) comprising, as calculated by mol % based on oxides, 30% of $P_2O_5$, 60% of SnO, 8.5% of ZnO, 0.5% of CaO and 1% of $B_2O_3$ was prepared in the same manner as in Example 1.

Example 7

Glass (glass of Example 7) comprising, as calculated by mol % based on oxides, 30% of $P_2O_5$, 60% of SnO, 9.5% of ZnO and 0.5% of CaO was prepared in the same manner as in Example 1.

Example 8

Glass (glass of Example 8) comprising, as calculated by mol % based on oxides, 32% of $P_2O_5$, 58% of SnO, 8% of ZnO and 2% of CaO was prepared in the same manner as in Example 1.

Example 9

Glass (glass of Example 9) comprising, as calculated by mol % based on oxides, 30% of $P_2O_5$, 60% of SnO, 9.5% of ZnO and 0.5% of $B_2O_3$ was prepared in the same manner as in Example 1.

(Measurement of Glass Transition Temperature (Tg))

The glass transition temperatures (Tg) of the glass samples of the respective Examples were measured. A differential thermal analyzer (differential thermal analysis apparatus EXSTAR6000TG/DTA, manufactured by Seiko Instruments Inc.) was used for measuring the glass transition temperature. 110 mg of a sample formed in a powder state was filled in a platinum pan and heated from room temperature to 500° C. at a temperature rising rate of 10° C./min.

Figure 3:
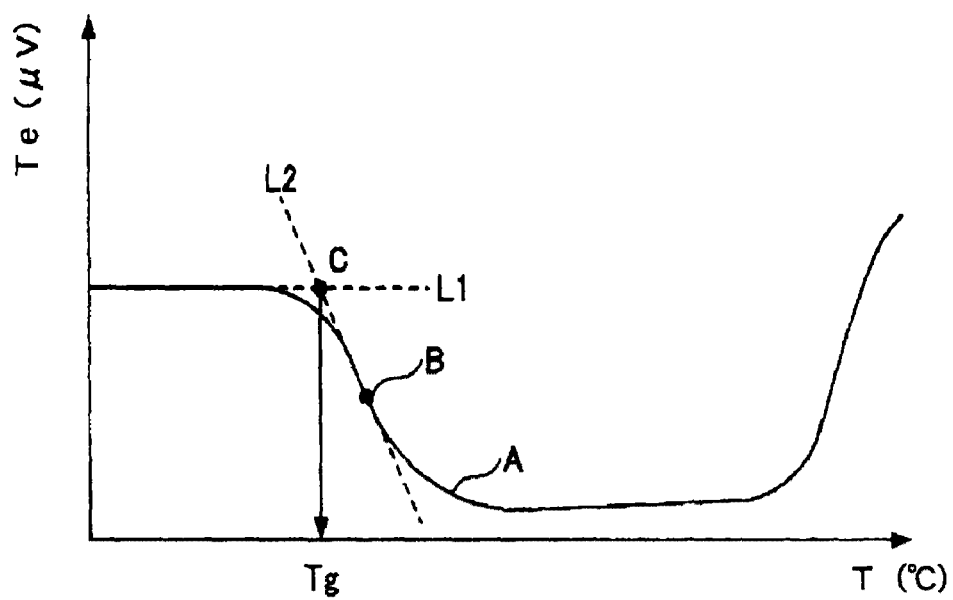
FIG. 3 is a figure schematically showing operation for obtaining a glass transition temperature (Tg) from DTA data. The abscissa represents T (temperature, ° C.), and the ordinate represents Te (thermal electromotive force, μV).

The glass transition temperature (Tg) was calculated from the result of the differential thermal analysis by the procedure shown in FIG. 3. First, in a region of a lower temperature side than a temperature where an endothermic peak A is formed at a lower temperature side, a straight line L1 is drawn so as to meet the flat part. Then, a straight line L2 is drawn so as to meet a curve part after an inflection point B of the endothermic peak A. An intersection point C of the two straight lines thus obtained is taken as the glass transition temperature (Tg).

(Measurement of Thermal Expansion Coefficient (a))

Each sample was processed into a column shape having a diameter of 5 mm and a length of 20 mm to prepare a test sample. This test sample was heated to 250° C. at a temperature rising rate of 10° C./min, and the thermal expansion coefficient at each temperature was measured by using a thermal dilatometer (a horizontal difference detection type thermal dilatometer TD5010, manufactured by Brucker AXS K.K.). Values at intervals of every 25° C. from 100 to 250° C. were obtained, and the thermal expansion coefficient α was obtained as the average of these values.

(Evaluation of Crystallization at the Time of Solidification)

200 g of each sample in a molten state at 1,100° C. was poured in a carbon mold, and whether or not crystals precipitate in the interior of glass was observed by visual observation until the sample was solidified.

(Sealing Test)

Each sample was subjected to sealing in an infrared ray condensing furnace at a heating temperature of 360° C., 370° C., 380° C., 390° C. or 400° C. The sealing condition at each temperature was observed. In Table 1, "◯" in the sealing temperature means that the sample was transparent and softened. "*1" means that the sample was transparent but not softened. "*2" means that the sample was white stained and not softened. "*3" means that the sample was softened but white stained.

(Weather Resistance Test)

The samples of Example 5 and Example 8 were left in a thermo-hygrostat bath and maintained at 80° C. under 80% RH, to carry out weather resistance test for about 100 hours. Then, a spectral transmittance at 460 nm was measured, and the sample having at least 50% of the spectral transmittance at 460 nm was evaluated as "◯", and the sample having the spectral transmittance of less than 50% was evaluated as "Δ".

The test results are shown in Table 1. It is evident from Table 1 that the glass of the present invention has a glass transition temperature (Tg) of from 285 to 300° C. in all cases. Further, the thermal expansion coefficient of the glass was from $121.1 \times 10^{-7}$/° C. to $127.2 \times 10^{-7}$/° C. Further, the glass of the present invention has a relatively broad sealing temperature range, is transparent, can be softened and is excellent in the weather resistance.

Further, in Table 1, "-" means that the measurement and evaluation were not carried out.

Similarly to Table 1, with the glass compositions shown in the following Table 2, glass which is equivalent to glass in Examples 1 to 8 in Table 1 can be obtained.

TABLE 2

| Composition | Example | | |
|---|---|---|---|
| (mol %) | 10 | 11 | 12 |
| $P_2O_5$ | 30 | 30 | 30 |
| SnO | 60 | 60 | 60 |
| ZnO | 5 | 5 | 5 |
| GaO | 3 | 3 | 3 |
| $B_2O_3$ | 1 | 1 | 1 |
| $Ga_2O_3$ | 1 | 0 | 0 |
| $In_2O_3$ | 0 | 1 | 0 |
| $La_2O_3$ | 0 | 0 | 1 |

(Evaluation of Properties as Coating Material)

Next, by actually employing the glass of the present invention, the sealing treatment of LED elements was carried out to evaluate the properties of the glass of the present invention as the sealing material.

Each glass of the Examples 4 and 6 was processed to have a thickness of about 1.5 mm, and then both surfaces were mirror polished. Then, the glass was cut to have a size of about 1.5 mm×1.5 mm to prepare a sample of sealing material.

A base substrate made of alumina on which a gold wiring pattern is formed (size: 14 mm length×14 mm width×thickness 1 mm) and members wherein a connection bump is formed to LED element (E1060-0B011-03, manufactured by Toyoda Gosei Co., Ltd.) were prepared. The LED element was mounted on the base substrate by Flip Chip Attach.

On the flip chip-mounted LED element, the sealing material sample was placed, the LED element was left in an electronic furnace, and the temperature was raised from room temperature to 400° C. at a rate of 100° C./min. After the temperature reached 400° C., the LED element was maintained at 400° C. for 2 minutes, and the glass substrate was softened and fluidized. The LED element was thereby covered with the glass to form an LED device. Then, the LED device was cooled to room temperature at a rate of 100° C./min. After the temperature reached room temperature, the LED device was removed from the furnace, and the condition of the sealing material was visually observed. Air bubbles were not observed on the surface and inside of the glass.

In order to evaluate properties of the LED device thus obtained, direct-current voltage was applied between both electrodes of the LED device to measure an emission starting voltage at which blue ray was emitted. The obtained emission starting voltage was within a range of from 2.2 to 2.4 V which was substantially the same as the value of bare chips. It is evident from the above evaluations that in the LED device using the glass of the present invention as a sealing material, each member was free from defects such as damages.

Thus, with the glass of the present invention, it is possible to carry out the sealing treatment at a temperature of less than 400° C.

INDUSTRIAL APPLICABILITY

The glass of the present invention can be used for coating and/or sealing LED elements which are used for e.g. backlight sources for liquid crystal panels, general illuminations and headlights of automobiles.

The entire disclosure of Japanese Patent Application No. 2008-003553 filed on Jan. 10, 2008 including specification, claims, drawings and summary is incorporated herein by reference in its entirety.

What is claimed is:

1. Glass comprising, as represented by mol % based on oxides,
from 27 to 30% of $P_2O_5$,
from 52 to 63% of SnO,
ZnO of at most 1/7 of the content of SnO,
from 0.5 to 5% of CaO,
from 0 to 5% of $B_2O_3$,
from 0 to 3% of $Ga_2O_3$,
from 0 to 3% of $In_2O_3$ and
from 0 to 3% of $La_2O_3$,
wherein
the total of $P_2O_5$+SnO is from 85 to 92% and
the glass contains substantially no $Li_2O$, $Na_2O$ and $K_2O$.

2. The glass according to claim 1, wherein the content of CaO is from 3 to 5% as represented by mol % based on oxides.

3. A sealing material for a light-emitting device, which is made of the glass as defined in claim 1.

4. A light-emitting device comprising
a base substrate;
a light-emitting element formed on the base substrate;
and a sealing material for the light-emitting element,
characterized in that the sealing material is made of the glass as defined in claim 1 or 2.

5. The light-emitting device according to claim 4, wherein the light-emitting element is a light-emitting diode (LED).

6. The glass according to claim 1, wherein the total content of CaO and $B_2O_3$ is 0.5 mol % to 5 mol %.

7. The glass according to claim 1, which contains substantially no PbO.

8. The glass according to claim 1, which contains substantially no MnO, $Fe_2O_3$, $Co_2O_3$ or $WO_3$.

9. A glass composition which consists essentially of the glass of claim 1.

10. A glass composition which consists of the glass of claim 1.

11. The glass according to claim 1, which can be sealed at a sealing temperature of less than 400° C.

12. A method of sealing at least one LED element, comprising heating the glass of claim 1 in contact with at least one LED element to a temperature of less than 400° C.

13. A method of sealing at least one LED element, comprising heating the glass composition of claim 11 in contact with at least one LED element to a temperature of less than 400° C.

14. A method of sealing at least one LED element, comprising heating the glass composition of claim 10 in contact with at least one LED element to a temperature of less than 400° C.

* * * * *